US012620773B2

(12) United States Patent
Komljenovic et al.

(10) Patent No.: US 12,620,773 B2
(45) Date of Patent: May 5, 2026

(54) PERFORMANCE HETEROGENEOUS LASERS AND ACTIVE COMPONENTS

(71) Applicant: Nexus Photonics, Inc., Goleta, CA (US)

(72) Inventors: Tin Komljenovic, Goleta, CA (US); Chong Zhang, Santa Barbara, CA (US); Minh Tran, Goleta, CA (US)

(73) Assignee: Nexus Photonics, Inc., Goleta, CA (US)

( * ) Notice: Subject to any disclaimer, the term of this patent is extended or adjusted under 35 U.S.C. 154(b) by 989 days.

(21) Appl. No.: 17/732,348

(22) Filed: Apr. 28, 2022

(65) Prior Publication Data

US 2023/0352908 A1 Nov. 2, 2023

(51) Int. Cl.
| | |
|---|---|
| *H01S 5/026* | (2006.01) |
| *H01S 5/0225* | (2021.01) |
| *H01S 5/065* | (2006.01) |
| *H01S 5/10* | (2021.01) |
| *H01S 5/34* | (2006.01) |

(52) U.S. Cl.
CPC ........... *H01S 5/026* (2013.01); *H01S 5/0225* (2021.01); *H01S 5/0653* (2013.01); *H01S 5/1014* (2013.01); *H01S 5/1032* (2013.01); *H01S 5/1085* (2013.01); *H01S 5/3412* (2013.01)

(58) Field of Classification Search
CPC ...... H01S 5/026; H01S 5/0653; H01S 5/1003; H01S 5/1014; H01S 5/1028; H01S 5/1032; H01S 5/1082; H01S 5/1085
See application file for complete search history.

(56) References Cited

U.S. PATENT DOCUMENTS

| | | | | |
|---|---|---|---|---|
| 9,941,664 B1 * | 4/2018 | Hahn | .................... | H01S 5/2054 |
| 10,859,764 B2 | 12/2020 | Park | | |
| 2003/0007719 A1 * | 1/2003 | Forrest | ............... | G02B 6/12004 |
| | | | | 385/14 |
| 2007/0242917 A1 * | 10/2007 | Blauvelt | ............. | G02B 6/4204 |
| | | | | 438/31 |
| 2013/0294472 A1 * | 11/2013 | Feng | ..................... | H01S 5/0424 |
| | | | | 372/50.22 |
| 2019/0280461 A1 * | 9/2019 | Menezo | .................. | H01S 5/125 |
| 2021/0010811 A1 * | 1/2021 | Paniccia | ............... | H01S 5/0085 |

(Continued)

*Primary Examiner* — Sean P Hagan
(74) *Attorney, Agent, or Firm* — LEEPI

(57) ABSTRACT

A device comprises first, second and third elements fabricated on a common substrate. The first element comprises an active waveguide structure supporting a first optical mode and at least one of the modal gain control structures. The second element comprises a passive waveguide structure supporting a second optical mode. The third element, at least partly butt-coupled to the first element, comprises an intermediate waveguide structure supporting intermediate optical modes. If the first optical mode differs from the second optical mode by more than a predetermined amount, a tapered waveguide structure in at least one of the second and third elements facilitate efficient adiabatic transformation between the second optical mode and one of the intermediate optical modes. No adiabatic transformation occurs between any of the intermediate optical modes and the first optical mode. Mutual alignments of the first, second and third elements are defined using lithographic alignment marks.

15 Claims, 15 Drawing Sheets

(56) References Cited

U.S. PATENT DOCUMENTS

| | | | |
|---|---|---|---|
| 2021/0088727 A1* | 3/2021 | Park | H01S 5/1064 |
| 2023/0139139 A1* | 5/2023 | Sugiyama | H01S 5/2275 |
| | | | 372/19 |

* cited by examiner

PERFORMANCE HETEROGENEOUS LASERS AND ACTIVE COMPONENTS

FIELD OF THE INVENTION

The present invention relates to semiconductor lasers, amplifiers, modulators, and photodetectors. More specifically, certain embodiments of the invention relate to improved performance of heterogeneously integrated lasers, amplifiers, modulators and photodetectors using dissimilar materials that are optically coupled.

BACKGROUND OF THE INVENTION

A photonic integrated circuit (PIC) or integrated optical circuit is a device that integrates multiple photonic functions and as such is analogous to an electronic integrated circuit. The major difference between the two is that a photonic integrated circuit provides functions for information signals imposed on optical carrier waves. The material platform most commercially utilized for photonic integrated circuits is indium phosphide (InP), which allows for the integration of various optically active and passive functions on the same chip. Although many current PICs are realized in InP platforms, there has been significant research in the past decade in using silicon rather than InP for the realization of PICs, due to some superior characteristics as well as superior processing capabilities for the former material, that leverage the investment already made for electronic integrated circuits.

The biggest drawback in using silicon for PICs is that it is an indirect bandgap material which makes it hard to provide electrically pumped optical sources. This problem is generally solved by assembling PICs comprising two or more chips made from dissimilar materials in separate processes. Such an approach is challenging due to a need for very fine alignment, which increases packaging costs and introduces scaling limitations. Another approach to solving the bandgap problem is to bond two dissimilar materials and process them together, removing the need for precise alignment during the bonding of larger pieces or complete wafers of the dissimilar materials, and allowing for mass fabrication. In this disclosure, we use the term "hybrid" to describe the first approach that includes precise assembly of separately processed parts, and we use the term "heterogeneous" to describe the latter approach of bonding two materials and then processing the bonded structure to define the waveguides and other components of interest.

To transfer the optical signal between dissimilar materials, the heterogeneous approach utilizes tapers whose dimensions are gradually changed until the effective mode refractive indices of dissimilar materials match and there is efficient power transfer. This approach generally works well when materials have similar refractive indices as is the case with silicon and InP. In cases where there is larger difference in effective indices, such as between e.g. SiN and GaAs, the requirements on taper tip dimensions become prohibitive limiting efficient power transfer. Specifically, extremely small taper tip widths (of the order of nanometers) may be necessary to provide good coupling. Achieving such dimensions is complex and may not be cost-effective.

Although InP and silicon-based PICs address many current needs, they have some limitations; among them are the fact that the operating wavelength range is limited by material absorption increasing the losses, and the fact that there is a limit on the maximum optical intensities and consequently optical powers that a PIC can handle. To address these limitations, alternate waveguide materials have been considered, such as SiN, $TiO_2$, $Ta_2O_5$, AlN or others. In general, such dielectric waveguides have higher bandgap energies which provides better high-power handling and transparency at shorter wavelength, but, in general such materials also have lower refractive indices. E.g. SiN with bandgap of ~5 eV has refractive index of ~2, AlN has bandgap of ~6 eV and refractive index of around ~2, and $SiO_2$ with bandgap of ~8.9 eV has refractive index of ~1.44. For comparison, the refractive index of both InP and GaAs is >3. This makes the tapered approach challenging.

The alternative hybrid approach suffers from the drawbacks already mentioned above, namely the need for precise alignment, and correspondingly complex packaging and scaling limitations.

A recent approach to the problems discussed above was presented in U.S. Pat. No. 10,859,764 B2, employing butt-coupling in combination with a mode-converter to allow the heterogenous process to be used without the need for extremely small taper widths. The present invention is directed towards PICs employing butt-coupling in this way, and that include an active device such as a laser, amplifiers, modulators and photodetectors with improved performance. In particular, embodiments described below are concerned with the detailed design of the optical coupling structure and mode control in the active components necessary for creating of high-performance lasers, amplifiers, modulators and photodetectors.

DETAILED DESCRIPTION

Described herein include embodiments of a platform for realization of photonic integrated circuits using wafer bonding and deposition of dissimilar materials where optical coupling is improved by use of mode conversion and a butt-coupling scheme, and performance is optimized for robust, fabrication tolerant coupling and mode-control in the active device.

In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized, and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

Figure 1:
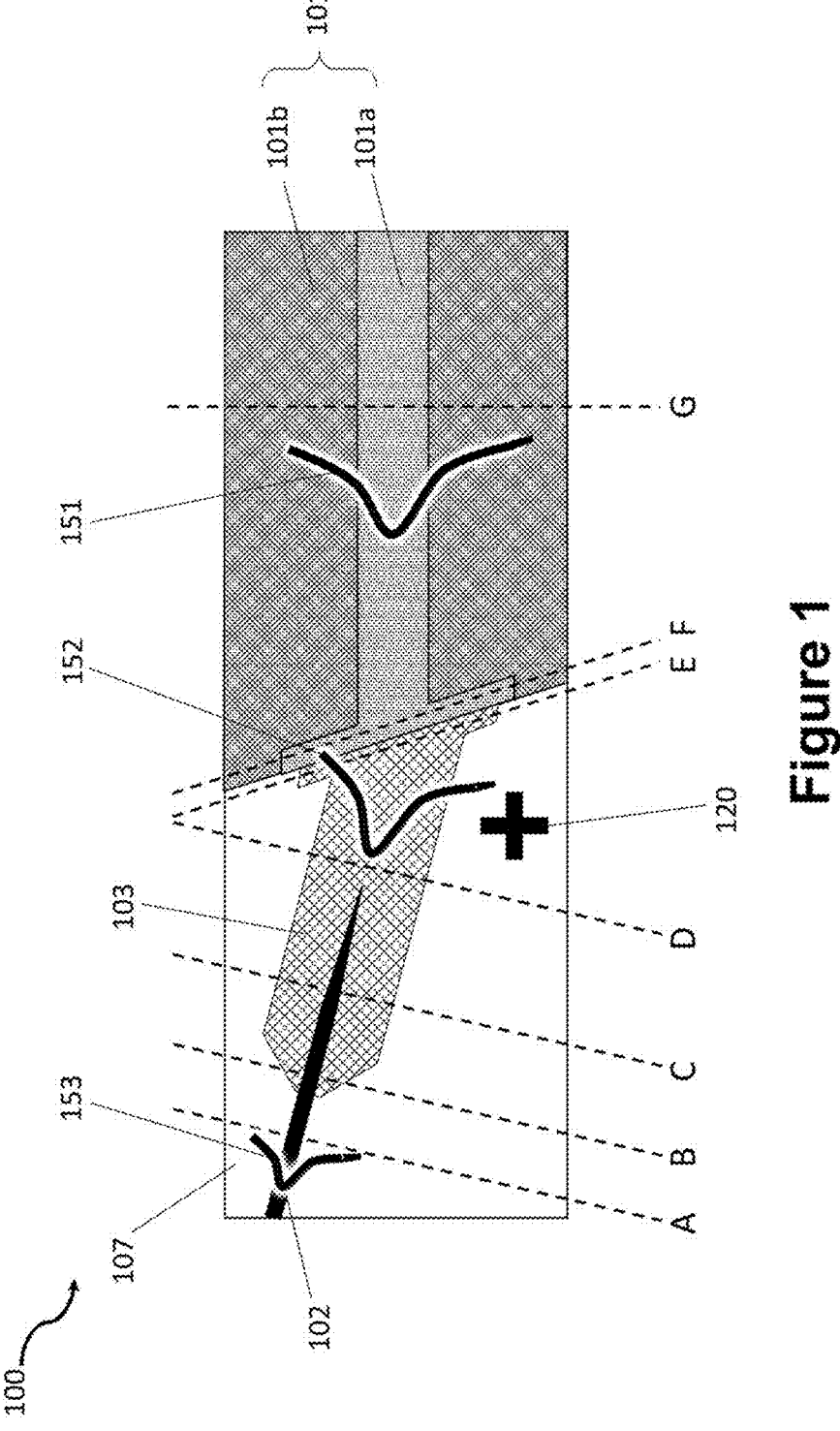
FIG. 1 illustrates a device according to one embodiment of the present invention, shown in top-down cross section view.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" means that two or more elements are in direct contact in at least part of their surfaces. The term "butt-coupled" is used herein in its normal sense of meaning an "end-on" or axial coupling, where there is minimal or zero axial offset between the elements in question. The axial offset may be, for example, slightly greater than zero in cases where a thin intervening layer of some sort is formed between the elements, such as e.g. thin coating layer typically used to provide high-reflectivity or anti-reflectivity functionality. It should be noted that the axes of two waveguide structures or elements need not be colinear for them to be accurately described as being butt-coupled. In other words, the interface between the elements need not be perpendicular to either axis. FIG. 1 embodiments discussed below are exemplary of such possibilities.

Term "active device" may be used herein. A device or a part of a device called active is capable of light generation, amplification, modulation and/or detection. This is in contrast to what we mean by a "passive device" whose principal function is to confine and guide light, and/or provide splitting, combining, filtering and/or other functionalities that are commonly associated with passive devices. Some passive devices can provide functions overlapping with active device functionality, such as e.g. phase tuning implemented using thermal effects or similar that can provide modulation. No absolute distinction should be assumed between "active" and "passive" based purely on material composition or device structure. A silicon device, for example, may be considered active under certain conditions of modulation, or detection of low wavelength radiation, but passive in most other situations.

FIG. 1 offers a top-down view of one embodiment of an integrated photonic device 100 utilizing butt-coupling and mode conversion for efficient coupling between dissimilar materials. Dashed lines A, B, C, D, E, F, and G correspond to cross-sectional end-on views of a device according to some embodiments of the present invention described in more detail with the help of FIG. 4 and more specifically end-on-views 400A, 400B, 400C, 400D, 400E, 400F, and 400G.

The optical mode 151, guided by structures defined in layer 101 is efficiently coupled to the optical mode 153 supported by structures defined in layer 102 or vice-versa as will be described in detail with the help of FIGS. 1, 2, 3 and 4.

Layer 101 makes up what is commonly called an active device, and may be made up of materials including, but not limited to, InP and InP-based ternary and quaternary materials, GaAs and GaAs based ternary and quaternary materials, GaN, GaP, InAs and InSb and their variations and derivatives. Layer 101 in one embodiment is multilayered, comprising layers providing both optical and electrical confinement as well as electrical contacts, as is known in the art for active devices. Two of such sub-layers 101a and 101b are present in view shown in FIG. 1, with more detailed description presented with the help of FIG. 4. Said multilayers generally providing vertical confinement. Horizontal confinement, in one of the embodiments, is provided by defining a ridge type structure (as also shown in 400G and described later). Horizontal confinement can also be provided by generating a strip structure (not shown), by implants or other techniques in the field. In either case, the intent of confinement structures is to control the position and shape of the optical mode, provide guiding and optimize the interaction between the optical mode and injected, generated and/or depleted carriers.

In this top-down view, two sublayers of layer 101 are shown. Sublayer 101a providing horizontal confinement functionality and sublayer 101b comprising active region of the active device. Active region is the volume in which majority of the interaction between carriers and optical modes takes place and typically comprises quantum wells, quantum dots and/or p(i)n-junctions. Dimensions of both 101a and 101b can be optimized along the length of device as e.g. shown in FIG. 1 where width of the 101a cross-section is larger at the interface with layer 103 (to be described).

The optical mode 151 supported by active layer 101 is guided to layer 103 that serves to convert the mode for efficient coupling to layer 102. Optional coating layers (not shown) such as e.g. high-reflectivity and/or anti-reflective coating layers can be used at any of the interfaces between layers, e.g. between layer 101 and layer 103. Layer 103 serves as an intermediate waveguide that in some embodiments accepts the profile of an optical mode 151, captures it efficiently as optical mode 152 supported by the waveguide for which layer 103 provided the core and gradually transfers it to the optical mode 153 for which layer 102 provides the core utilizing tapers in at least one of the layers 102 and 103. The embodiment shown in FIG. 1 illustrates tapers in both layers 102 and 103, but similar functionality can be realized with taper only in one of the layers (not shown). Said tapers can be multilayered, e.g. utilizing multiple etches.

The refractive index and dimensions of layer 103 can be engineered to facilitate efficient coupling between both modes 151 and 152 (utilizing butt-coupling approach) and modes 152 and 153 (utilizing adiabatic transition with at least one taper). In some embodiments, the refractive index of layer 103 is between 1.55 and 1.8, which enables efficient (butt)coupling from layer 101 whose effective refractive index is generally larger than 3 (if based on GaAs or InP material systems) and various geometries of layer 102 when the refractive index of layer 102 is between 1.6 and 2.5. In some embodiments layer 103 is realized as SiON (silicon oxynitride) layer in which precise refractive index can be tailored during the deposition in the range between the refractive index of SiO2 (~1.44) and SiN (~2) materials. In other embodiments, layer 103 is realized as polymer, many of which have suitable range of refractive indices. In yet other embodiments, other materials with suitable refractive index are utilized.

Layer 102 in one embodiment is SiN with refractive index of ~2. In some embodiments, layer 102 is a SiON layer with refractive index<2. In yet other embodiment, layer 102 is LiNbO3 with refractive index of ~2.2. In yet other embodiments, materials such as Ta2O5, Al2O3 or AlN are used for layer 102. Note that all the materials refractive indices have wavelength dependencies and approximate numbers are given for near-infrared range.

Dimensions (or more specifically thicknesses) of layers 101 are generally optimized for the performance of the active devices, while dimensions (or more specifically thickness) of layer 102 are (is) generally optimized for the performance of the passive devices, while dimensions (both thickness and widths) of layer 103 are optimized for efficient coupling between modes 151 and 153. Widths of all waveguides, realized in any of the layers, are controllable by the lithography, etch and deposition steps as is known in the art.

The upper cladding layer 107 for waveguides realized in 103 and/or 102 can be ambient air (meaning no cladding material is actually deposited) or can be any other deliberately deposited suitable material, including, but not limited to, a polymer, SiO2, SiN, SiON etc. In all cases, the refractive index of cladding 107 is lower than the refractive index of both layers 102 and 103. In some embodiments, multiple materials can serve as cladding 107 with some providing additional functionality such as e.g. surface passivation. In other embodiments (not shown), different claddings can be utilized for waveguides whose cores are defined in layer 101, 102 and/or 103.

One or more lithographic alignment marks 120 (only one shown for simplicity) are used for precise alignment between various processing steps used to define waveguides, contacts and other features.

Each boundary of different layers (e.g. between 101 and 103) can comprise additional thin layers (not shown) that serve as anti-reflective coatings to facilitate more efficient power transfer or provide surface passivation functionality to improve the performance of the active devices.

Figure 2:
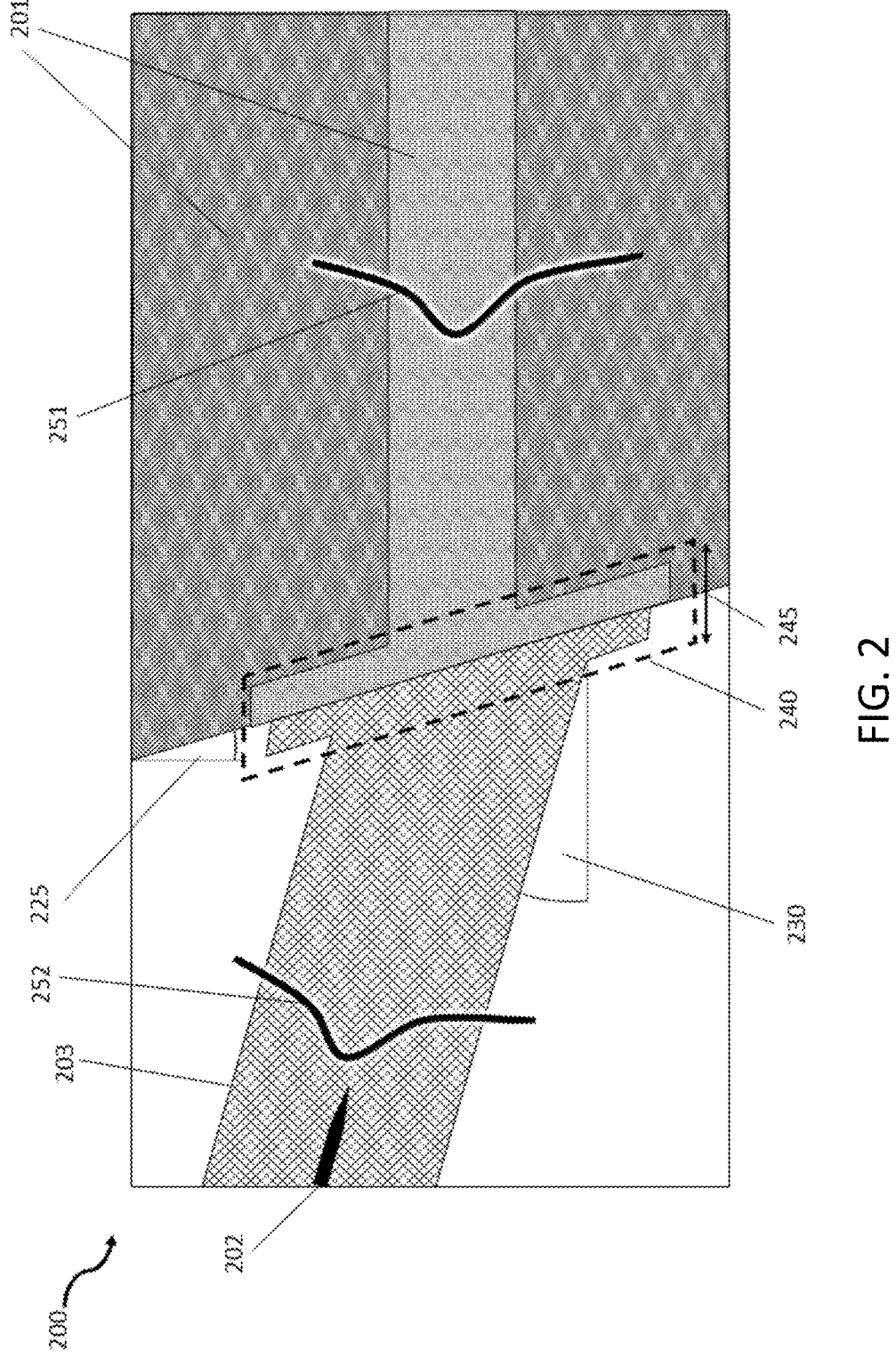
FIG. 2 shows a cross-sectional top-down view of a device according to some embodiments of the present invention.

FIG. 2 depicts a zoom-in of the top-down view of one embodiment of an integrated photonic device 200 (as described in relation to FIG. 1) to define and describe the interface between active layers 201 and intermediate layer 203. The interface between the two layers 201 and 203 in this embodiment is angled to control the corresponding backreflections that can negatively impact performance of components comprising a photonic integrated circuit. Optional coating layers (not shown) such as e.g. high-reflectivity and/or anti-reflective coating layers can be used at any of the interfaces between layers.

The angle 225 defines the angle between the tangent of the direction of propagation of the mode 251 inside structure 201 and the facet (interface toward 203). Angle 225 is primarily utilized to control the backreflection of the mode supported by layer 201 when it reaches the interface toward 203. In one embodiment it is substantially equal to 8°. In yet another embodiment it is between 8° and 20°. In yet other embodiments the angle can be larger than 20°.

In yet other embodiments, where backreflection is actually beneficial for the component performance, the angle is substantially smaller than 8°, and can be substantially equal to 0° if reflection from this interface is utilized as e.g. mirror (not shown).

The angle 230 defines the angle between the direction of the propagation of the mode 251 inside the structure 201 and the angle of the direction of the propagation of the mode 252 inside the structure 203. Said angle is an optimization parameter for coupling efficiency between the modes supported by layer 201 and 203 and is related to the choice of the angle 225 and/or the refractive indices of used materials in layers 201 and 203 and their respective claddings. In most embodiments, said angle 230 is between 0° and 45°, but the precise value is a result of numerical optimization which can be done using e.g. commercial electromagnetic software.

Precise vertical alignment (up/down in FIG. 2) between the axis defined by the direction of the propagation of the wave inside the structure 201 and the center of the waveguide 203 at the interface to 201 is an optimization parameter where such offset can be positive (up in FIG. 2), negative (down in FIG. 2) and/or substantially equal to 0 (no offset). Such optimization is straightforward to perform with numerical software to maximize the performance of the transition together with optimizing the angle 225.

A specific region 240 is outlined in FIG. 2 corresponding to what we call wall region. Wall region 240 has enlarged dimensions for at least one of the layers 201 and 203 (and illustrated for both in the embodiment shown in FIG. 2), compared to regions outside the wall region. The enlarged dimensions of wall region serve to improve the performance of higher power designs by increasing the area of the facet which can dissipate heat, reduce the optical intensities and/or carrier densities. Furthermore, the increase in size helps with reducing the thermal impedance and consequently the temperature at the facet further improving the performance. In the embodiment, as sketched in FIG. 2, the optical mode 251 supported in layer 201 and the optical mode 252 supported in layer 203 are not guided inside the wall region 240 (due to larger cross-sectional dimensions), but are slowly diverging. Typically wall is of limited thickness 245 so the effect of the divergence has minimal impact on the coupling efficiency between 251 and 252. In some embodiments, the total wall thickness 245 is less than 10 μm. In yet other embodiments, the total wall thickness is less than 2 μm. In other embodiments, the total wall thickness is a function of mode size, wavelength of operation and/or average intensities of the optical field and can be optimized in wider range of up to 100s of μm or more. Total thickness 245 is an optimization parameter that depends on wavelength of operation, mode 251 and mode 252 sizes when guided, optical intensity at the facet, carrier density at the facet, and can be optimized using commercial electromagnetic software to provide high level of optical transmission.

Figure 3:
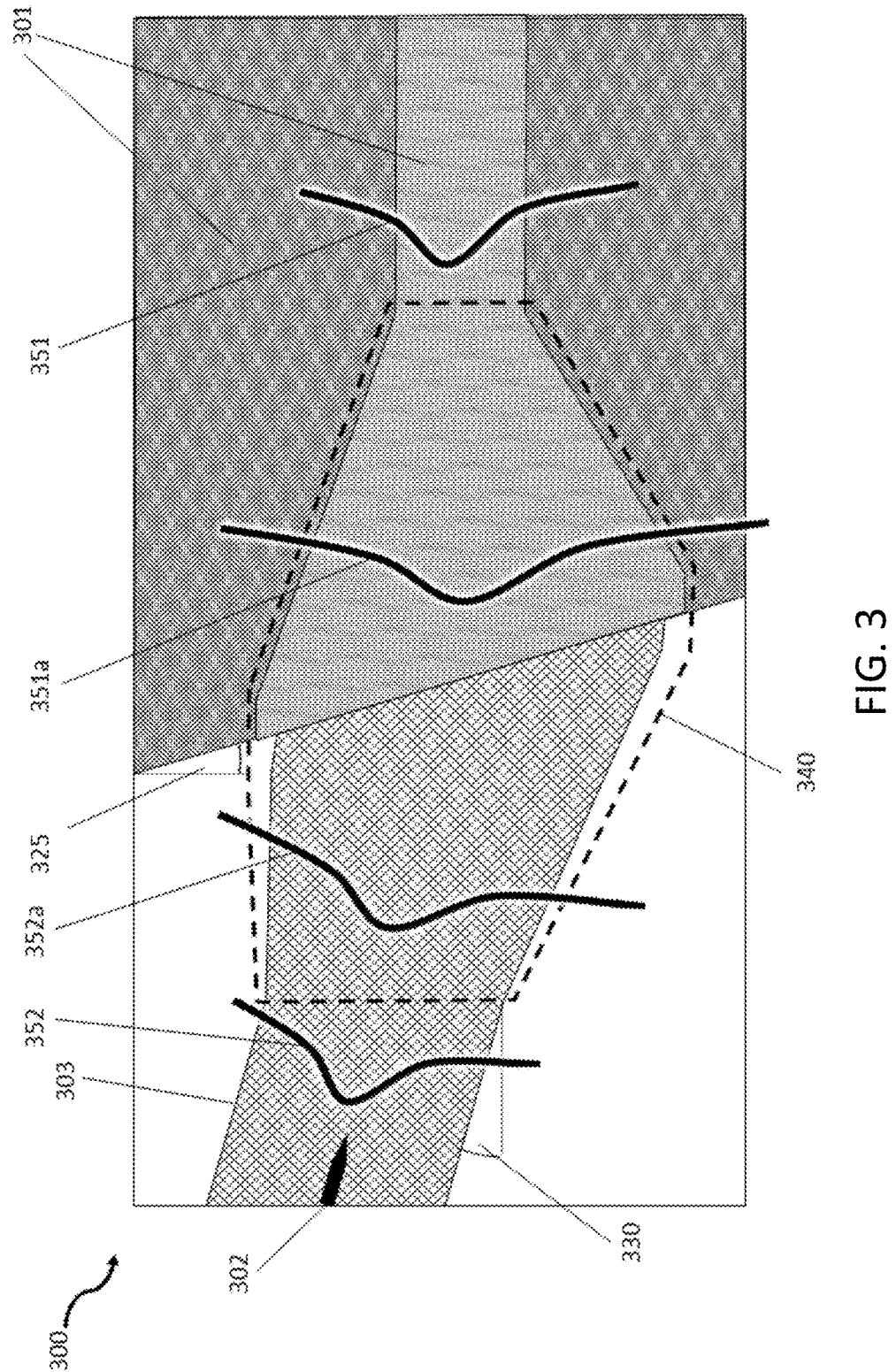
FIG. 3 shows a cross-sectional top-down view of a device according to some embodiments of the present invention.
Figure 4A:
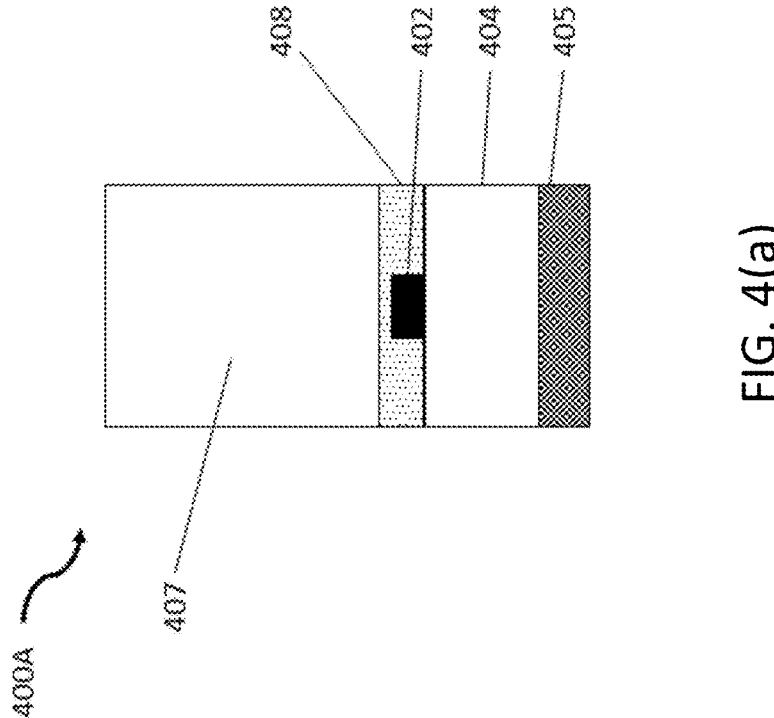
FIGS. 4(a) to (g) shows cross-sectional end-on views of a device according to some embodiments of the present invention.
Figure 4B:
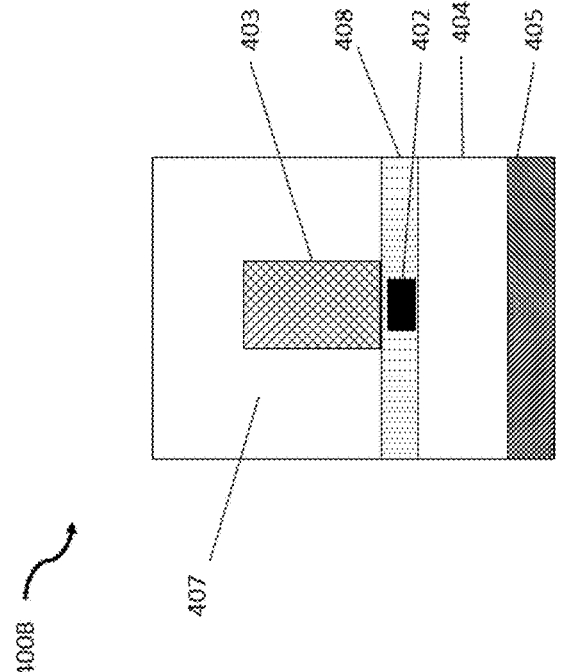
Figure 4C:
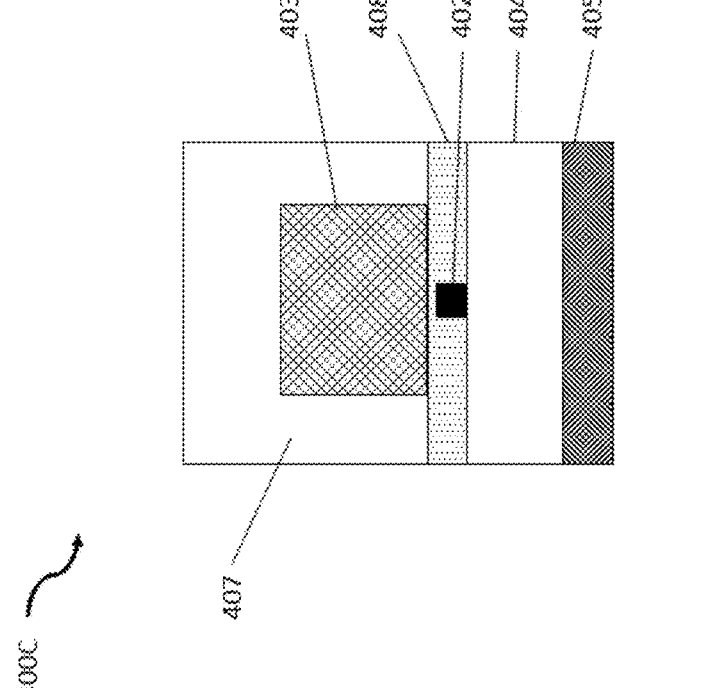
Figure 4D:
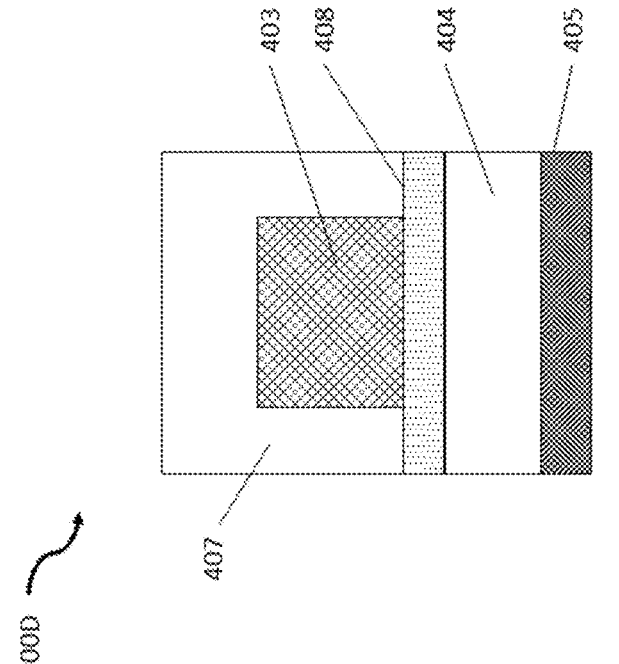
Figure 4E:
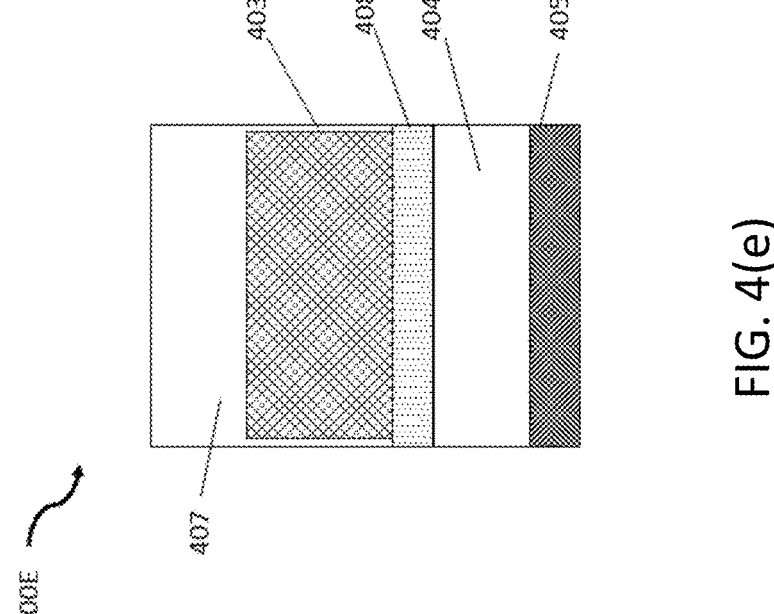
Figure 4F:
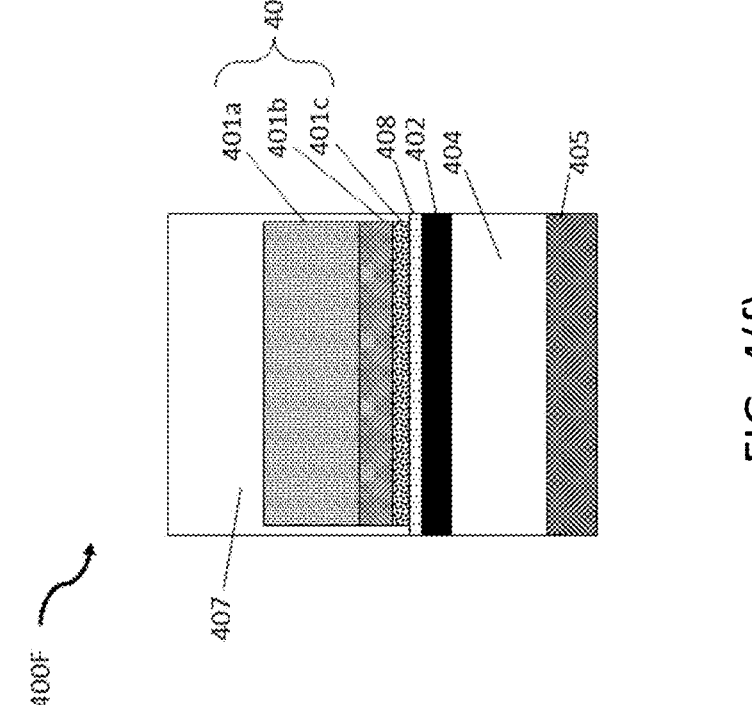
Figure 4G:
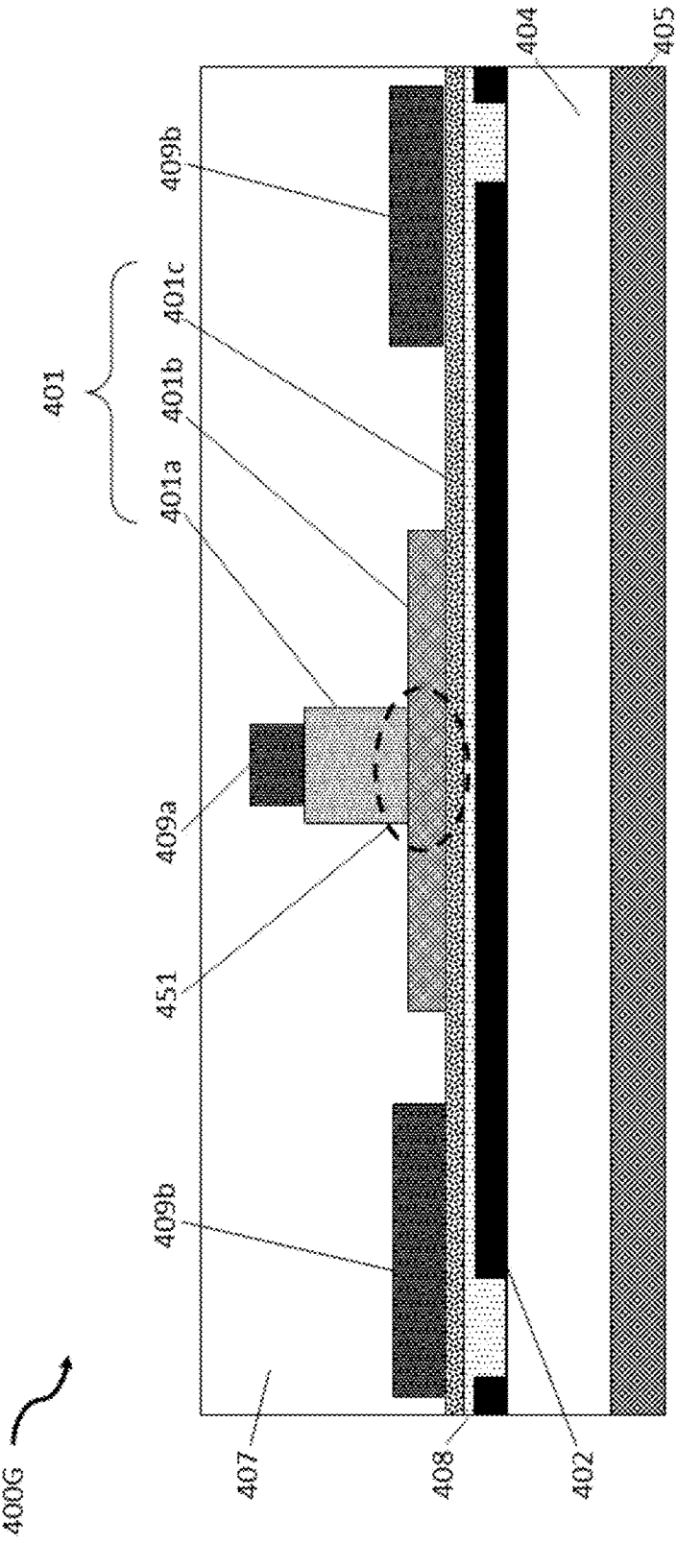

FIG. 3 depicts a zoom-in of the top-down view of one embodiment of an integrated photonic device 300 (as described in relation to FIG. 1) to define and describe the interface between active layers 301 and intermediate layer 303 optimized for high-power operation. The interface between the two layers 301 and 303 in this embodiment is angled to control the corresponding backreflections that can negatively impact performance of components comprising a photonic integrated circuit. Optional coating layers (not shown) such as e.g. high-reflectivity and/or anti-reflective coating layers can be used at any of the interfaces between layers.

The angle 325 defines the angle between the tangent of the direction of propagation of the mode 351 inside structure 301 and the facet (interface toward 303). Angle 325 is primarily utilized to control the backreflection of the desired modes supported by layer 301 when it reaches the interface toward 303. In one embodiment it is substantially equal to 8°. In yet another embodiment it is between 8° and 20°. In yet other embodiments the angle can be larger than 20°.

In yet other embodiments, where backreflection is actually beneficial for the component performance, the angle is substantially smaller than 8°, and can be substantially equal to 0° if reflection from this interface is utilized as e.g. mirror (not shown).

The angle 330 defines the angle between the direction of the propagation of the mode 351 inside the structure 301 and direction of the propagation of the mode 352 inside the structure 303. Said angle is an optimization parameter for coupling efficiency between the modes supported by layer 301 and 303 and is related to the choice of the angle 325 and/or the refractive indices of used materials in layers 301 and 303 and their respective claddings. In most embodiments, said angle 330 is between 0° and 45°, but the precise value is a result of numerical optimization which can be done using e.g. commercial electromagnetic software.

Precise vertical alignment (up/down in FIG. 3) between the axis defined by the direction of the propagation of the wave inside the structure 301 and the center of the waveguide 303 at the interface to 301 is an optimization parameter where such offset can be positive (up in FIG. 3), negative (down in FIG. 3) and/or substantially equal to 0 (no offset). Such optimization is straightforward to perform with numerical software to maximize the performance of the transition together with optimizing the angle 325.

A specific region 340 is outlined in FIG. 3 corresponding to what we call flared wall region. Flared wall region 340 has enlarged dimensions for at least one of the layers 301 and 303 (and illustrated for both in the embodiment shown in FIG. 3), compared to regions outside the flared wall region. The enlarged dimensions of flared wall region serve to improve the performance of higher power designs by increasing the area of the facet which can reduce the optical intensities and/or carrier densities. Furthermore, the increase in size helps with reducing the thermal impedance and consequently the temperature at the facet further improving the performance. In the embodiment, as sketched in FIG. 3 and in-contrast to embodiment sketched in FIG. 2, the optical mode 351 supported in layer 301 outside the flared wall region 340 and the optical mode 352 supported in layer 303 outside the flared wall region 340 are gradually transformed to modes 351a and 352a, both of which have larger effective area and consequently lower optical intensities enabling higher powers.

In the remaining part of this disclosure, term wall region includes both the wall region as described with the help of FIG. 2 and flared wall region as described with the help of FIG. 3.

Prior to the present invention i.e. in the absence of intermediate layer 103/203/303, the requirements on taper tip width for direct transfer between layer 101/201/301 and 102/202/302 would be problematic due to the difference in their effective refractive index. Taper tips as narrow as 100 nm or less would have to be resolved in higher refractive index material 101/201/301. Electrical pumping of such taper tips can also be challenging further negatively impacting device performance in come embodiments. The use of intermediate layer 103/203/303 that is butt-coupled, albeit with angled interface in some embodiments, to layer 101/201/301, however, significantly reduces the stringent requirements on taper tip widths, allowing efficient transfer between high refractive index materials (layer 101/201/301) to low refractive index materials (layer 102/202/302). No adiabatic transformation occurs between the optical modes supported by elements 101/201/301 and 103/203/303 at the butt-coupled interface.

FIG. 4 shows seven cross-sectional views 400A, 400B, 400C, 400D, 400E, 400F, and 400G corresponding to seven characteristic locations marked A, B, C, D, E, F, and G in FIG. 1. Functional layers 401 to 407 (unless explicitly defined differently) correspond to functional layers 101 to 107 as described in relation to FIG. 1.

Cross-section 400A shows one embodiment at the far left of the device as shown in FIG. 1, after optical coupling to layer 402 (assuming optical signal flow occurs from right to left in FIG. 1) is complete. Details on how exemplary device is fabricated will be described with the help of FIG. 5. Layer 405 is the substrate, and can be any suitable substrate for semiconductor and dielectric processing, such as Si, InP, GaAs, quartz, sapphire, glass, GaN, silicon-on-insulator or other materials known in the art. Layer 404 is an optional layer, whose main purpose is to provide optical cladding for waveguide defined in layer 402, if necessary to form an optical waveguide. Optical waveguides are commonly realized by placing higher refractive index core between two lower refractive index layers to confine the optical wave. In some embodiments, layer 404 is omitted and substrate 405 itself serves as a cladding. Layer 402 is waveguide core material for the passive devices. Layer 408, whose refractive index is lower than the refractive index of layer 402, overlays layer 402 and underlays layers 401 and 403 (not shown in cross-section 400A, but visible in cross-sections 400B-400G and FIG. 5). Layer 408 serves to planarize the surface such that both bottom surfaces of layer 403 and 401 are planar and at same height from the substrate 405. In some embodiments, layer 408 covers top surface of layer 402 (as sketched in FIG. 4) with some remaining thickness, typically smaller than 250 nm. In other embodiments (not shown), the thickness of layer 408 is such that its top surface is at the same height as the top surface of layer 402, i.e. no remaining thickness of layer 408 on top of layer 402. Layer 407 serves as top cladding if thickness of layer 408 above top surface of layer 402 is not sufficient to fully confine the tail of the optical mode. Layer 407 can comprise multiple materials, each providing cladding functionality to respective waveguides formed in layers 401, 402 and 403, including also surface passivation functionality.

Cross-sections 400B and 400C show the region in which tapers in both layers 402 and 403 serve to transition from optical mode 153 present in cross-section 400A to optical mode 152 present in cross-section 400D. In some embodiments (not shown) taper can be in only one of the layers 402 or 403. The transformation utilizes adiabatic taper between the two layers, with dominant transition happening when there is phase matching between mode dominantly residing in layer 402 and mode dominantly residing in layer 403. As this phase matching can be engineered to happen at larger waveguide widths due to the relatively small difference in effective indices between these two layers, the need for very fine taper tips can be eliminated. In some cases, tapers as wide as e.g. 200 nm or wider can support efficient transmission enabling high yield fabrication even if standard lithography is utilized. In other cases, narrower tapers, e.g. with width approaching 100 nm, can be utilized which can also be fabricated using high-quality DUV lithography enabling high-throughput fabrication Transition between cross-sections 400D and 400E can be abrupt as described with the help of FIG. 2, or can be gradual as described with the help of FIG. 3. In both cases, the mode is dominantly residing inside the layer 403, while at least two of the layers 404, 405, 407 and 408 provide cladding functionality, depending on the thickness of the layer 408 and if layer 404 is present.

Figure 5:
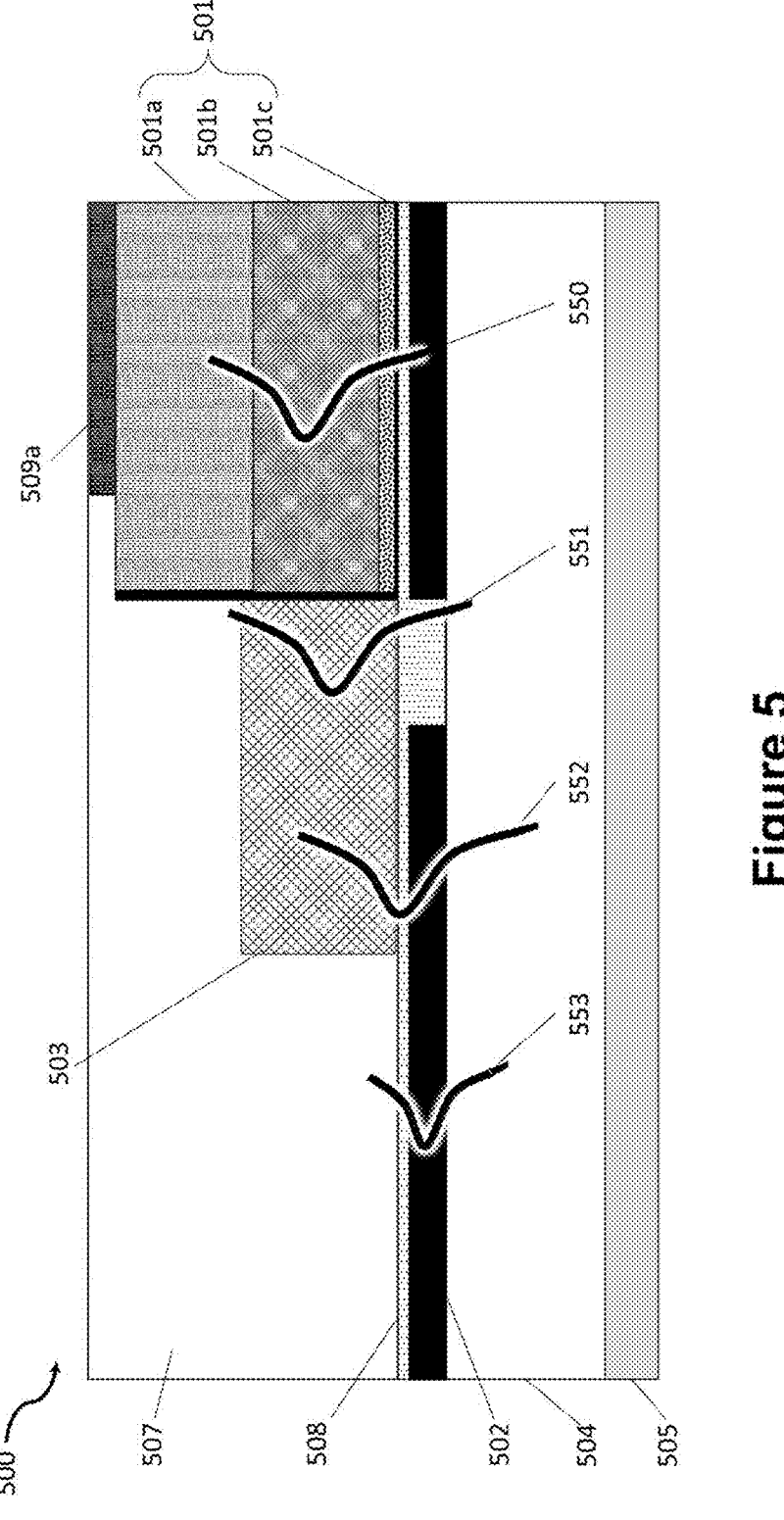
FIG. 5 shows a cross-sectional view of a device according to some embodiments of the present invention.

Transition between cross-section 400E and cross-section 400F utilizes butt-coupling as described with the help of FIGS. 1-3, and as will be further described with the help of FIG. 5. Wall structure at cross-section 400E comprises of layer 403, with only tails of the mode being in the cladding materials (at least two of layers 404, 405, 407 and 408), while the wall-structure at cross-section 400F comprises three sublayers 401a, 401b and 401c forming layer 401 and cladding materials 404, 405, 407 and 408. The three sublayers 401a, 401b and 401c are described in more detail with the help of cross-section 400G. This transition between 400E and 400F comprises the wall region.

Note that although the shape of layer 403 is sketched as a rectangle, in some other cases, the shape of the layer 403 could be modified e.g. slanted sidewall and/or rib geometry to provide better overlap between optical modes depicted in 151 and 152 (not shown).

Cross-section 400G shows one embodiment of cross-section at the far right of the device as shown in FIG. 1 when the optical mode 451 (151 in FIG. 1) is guided by structures realized in layer 401 comprising sublayers 401a, 401b and 401c. Sublayer 401a in some embodiments comprises at least one of the contact layers (either p-contact or n-contact) and optionally a corresponding cladding layer (p-cladding or n-cladding) with the optical mode being laterally confined by etch defining the mesa or ridge. The corresponding metal 409a (either p-metal or n-metal) is deposited on top of sublayer 401a with optional cladding layer and parts of sub-layer 401b serving to provide reduced internal loss by controlling the overlap between the optical mode 451 and metal 409a and contact layers of sublayer 401a. Sublayer 401a can comprise additional layers such as bandgap smoothing layers, etch stop layers, graded layers, electron blocking layers, etc. to provide improved performance or facilitate more robust fabrication as is known in the art of semiconductor device design and fabrication.

Sublayer 401b comprises active region of the active device. In some embodiments the active region comprises of quantum well, quantum dot, pn junction and/or pin junction layers with optional separate-confinement heterostructure (SCH) layers. Sublayer 401b can comprise additional layers such as second cladding layers, bandgap smoothing layers, etch-stop layers, graded layers, etc. to provide improved performance and facilitate more robust fabrication as is known in the art of semiconductor device design and fabrication. The width of sublayer 401b, as sketched in horizontal direction in cross-section 400G, is greater than the width of sublayer 401a. In other embodiments, the width of sublayer 401b is substantially equal to the width of sublayer 401a (not shown) accounting for process related limitations (sidewall angle, subsequent lithography step alignment precision, different etch rates for different material compositions, etc).

Sublayer 401c comprises second contact layers (opposite polarity than sub-layer 401a) and optional superlattice layers to facilitate bonding and/or prevent dislocations. Sublayer 401c can also comprise additional layers such as cladding layers, bandgap smoothing layers, etch-stop layers, graded layers, etc. to provide improved performance and facilitate more robust fabrication as is known in the art of semiconductor device design and fabrication. The width of sublayer 401c, as sketched in horizontal direction in cross-section 400G, is greater than the width of either sublayer 401a and sublayer 401b. Metal 409b is laterally offset from the optical mode 451 (whose lateral confinement is defined by at least one etch) leading to very low or negligible optical loss due to the contact metal regardless of the thickness of the respective cladding layers, in contrast to case of metal 409a where cladding thickness directly impacts the overlap between the mode 451 and metal 409a. Layer 402 can be unpatterned below the optical mode (as shown in cross-section 400G), or can be patterned (not shown) to provide additional functionalities, e.g. frequency-selective feedback to the optical mode 451 via evanescent field.

FIG. 5 is a schematic cross-section view of one embodiment of an integrated photonic device 500. Functional layers 501 to 507 (unless explicitly defined differently) correspond to functional layers 101 to 107 as described in relation to FIG. 1 and functional layers 501 to 509a (unless explicitly defined differently) correspond to functional layers 401 to 409a as described in relation to FIG. 4.

The exemplary cross-section includes a substrate 505 that can be any suitable substrate for semiconductor and dielectric processing, such as Si, InP, GaAs, quartz, sapphire, glass, GaN, silicon-on-insulator or other materials known in the art. In the shown embodiment, a layer of second material 504 is deposited, grown, transferred, bonded or otherwise attached to the top surface of substrate 505 using techniques known in the field. The main purpose of layer 504 is to provide optical cladding for material 502, if necessary to form an optical waveguide. Optical waveguides are commonly realized by placing higher refractive index core between two lower refractive index layers to confine the optical wave. In some embodiments, layer 504 is omitted and substrate 505 itself serves as a cladding.

Layer 502 is deposited, grown, transferred, bonded or otherwise attached to the top of layer 504 if present, and/or to the top of substrate 505, using techniques known in the field. The refractive index of layer 502 is higher than the refractive index of layer 504 if present, or, if layer 504 is not present, the refractive index of layer 502 is higher than the refractive index of substrate 505. Layers 504 and/or 502 can be patterned, etched, planarized and/or redeposited as is common in the art.

Layer 508, whose refractive index is lower than the refractive index of layer 502, overlays layer 502 and underlays layers 501 and 503 serves to planarize the patterned surface of layer 502. In some embodiments, the planarity of the top surface of layer 508 is provided by chemical mechanical polishing (CMP) or other etching, chemical and/or mechanical polishing methods. In other embodiments, the planarity is provided because of the intrinsic nature of the method by which layer 508 is deposited, for example if the material of layer 508 is a spin-on glass, polymer, photoresist or other suitable material. The planarization may be controlled to leave a layer of desired, typically very low, thickness on top of the layer 502 (as shown in FIG. 5), or to remove all material above the level of the top surface of the layer 502 (not shown). In the case layer 508 is left on top of layer 502, the target thicknesses are in the range of 10 nm to several hundreds of nm, with practical thickness includes the typical across wafer non-uniformity of the planarization process. In some embodiments, spin-on material is used to planarize and is then etched back resulting with improved across wafer uniformity compared to typical CMP processes.

Layer 501 is bonded on top of the whole or part of the corresponding (508, 502) top surface. Said bonding can be direct molecular bonding or can use additional materials to facilitate bonding such as e.g. polymer films as is known in the art. Layer 501 comprises multiple sublayers 501a, 501b and 501c as described with the help of FIG. 1-4. As mentioned prior, layer 502 can be fully removed below layer 501 (not shown) with e.g. patterning and etch prior to deposition of layer 508.

The present invention enables efficient optical coupling between waveguides formed in layer 501 and layer 502 that is facilitated by layer 503. Layer 503 serves as an intermediate waveguide that in some embodiments accepts the profile (depicted by line 550) of an optical mode supported by the waveguide for which layer 501 provides the core, captures it efficiently as mode profile 551, and gradually transfers it to mode profiles 552, and finally 553. Mode profile 553 is efficiently guided in the waveguide for which layer 502 provides the core. In other embodiments, the direction of travel may be reversed, with layer 503 efficiently capturing an optical mode 553 supported by the waveguide for which layer 502 provides the core and gradually transforming its mode profile to that of a mode 550 supported by the waveguide for which layer 501 provides the core. Both the thickness and the refractive index of layer 503 can be engineered to facilitate efficient coupling between both: modes 550 and 551 (utilizing butt-coupling approach) and modes 551 and 553 (utilizing adiabatic transition with one or more tapers as illustrated with the help of FIG. 1).

Prior to the present invention i.e. in the absence of intermediate layer 503, the requirements on taper tip width in layer 501 to facilitate efficient transfer of the optical mode to layer 502 would be, as discussed above, problematic with challenging lithography and challenging pumping of the active region in the taper. The use of intermediate layer 503, however, significantly reduces the stringent requirements on taper tip width, allowing efficient transfer between very high refractive index materials (such as e.g. GaAs in layer 501) to low refractive index materials (such as e.g. SiN in layer 502).

Differences between the optical modes supported by waveguides in layers 501 and 502 respectively may or may not be obvious by observation of the mode profiles, but mode overlaps less than 100% and vertical offset (in FIG. 5) between modes 550 and 553 could (in the absence of intermediate layer 503) result in significant optical loss. In some cases, it may be considered that losses of up to 1 dB are acceptable, but losses greater than that are not. In other cases, a 3 dB loss level may be the criterion chosen. The function of layer 503 is to keep optical loss due to imperfect mode overlap below whatever is determined to be an acceptable level in a given application.

The upper cladding layer 507 for waveguides realized in 503 and/or 502 can be ambient air (meaning no cladding material is actually deposited) or can be any other deliberately deposited suitable material as shown in FIG. 5, including, but not limited to, a polymer, SiO2, SiN, SiON etc. In some embodiments same material is used for layer 507 and layer 508.

In some embodiments, layer 508 is not present and both layer 501 is bonded and layer 503 is deposited on top of a patterned layer 102 and lower cladding 504. In such embodiments, there is no planarization step. This can provide for a simplified processing flow (removing the need for planarization) at the expense of generally reduced coupling efficiency due to lower coupling efficiency between modes 550 and 551, and also more challenging requirements on the taper tip widths in layer 502 to facilitate adiabatic transition from mode 551 to mode 552 and finally mode 553.

Figure 6:
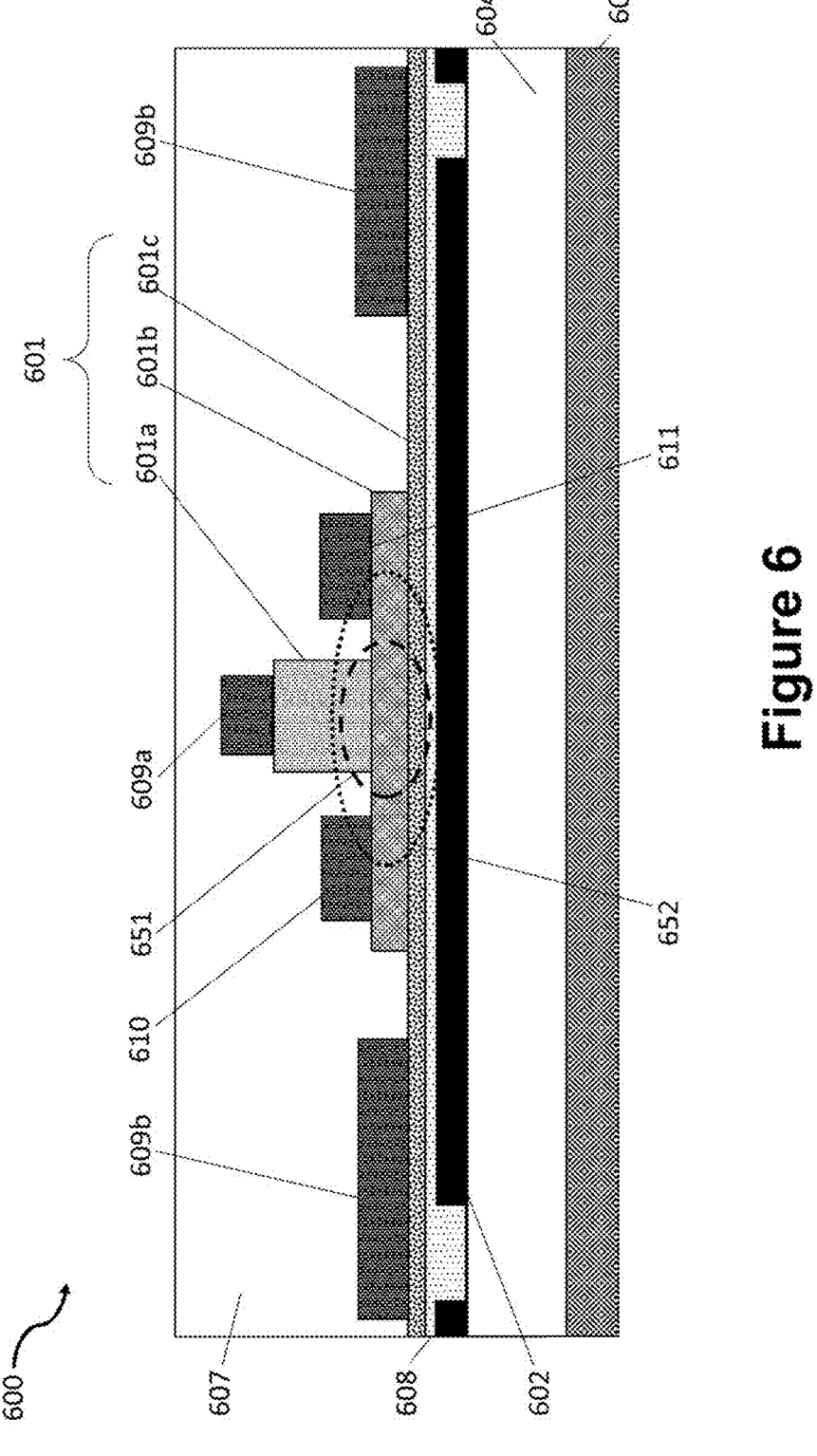
FIG. 6 shows a cross-sectional end-on view of a device according to some embodiments of the present invention.

FIG. 6 shows a cross-section 600 of one embodiment of present invention used to optimize the modal gain. Cross-section 600 is similar to cross-section 400G described above, with functional layers 601, 601a, 601b, 601c, 602, 604, 605, 607, 608, 609a, and 609b corresponding to functional layers 401, 401a, 401b, 401c, 402, 404, 405, 407, 408, 409a, and 409b as described in relation to cross-section 400G. A difference is the introduction of additional layers 610 and 611 which serve to control the modal gain in the active region of layer 601. In some embodiments, the waveguide structure defined in layer 601 supports more than one optical mode, two of which (651 and 652) are illustrated in FIG. 6, but more than two can be supported. Layers 610 and 611 have high optical loss, e.g. they are metal, their bandgap is below the photon energy and/or they are made from any other suitable material characterized by high loss constant at the wavelength of interest. The position of layers 610 and 611 relative to optical modes 651 and 652 can be optimized such that the impact of layers 610 and 611 on modal loss is different between modes 651 and 652 due to different mode overlaps with said regions. By optimizing the mode shapes and position of 610 and 611, modal gain between various supported modes can be optimized to facilitate better device performance, especially in the case of high-power lasers and amplifiers in which stronger injection currents are typically used. Layers 610 and 611 can be continuous along the length of the structure (which is surface normal to the cross-section 600), or they can be suitably patterned. In some embodiments, only one of the layers 610 and/or 611 is present (not shown). Modal gain control structures, as illustrated in FIG. 6, are called pad structures for modal gain control.

Figure 7A:
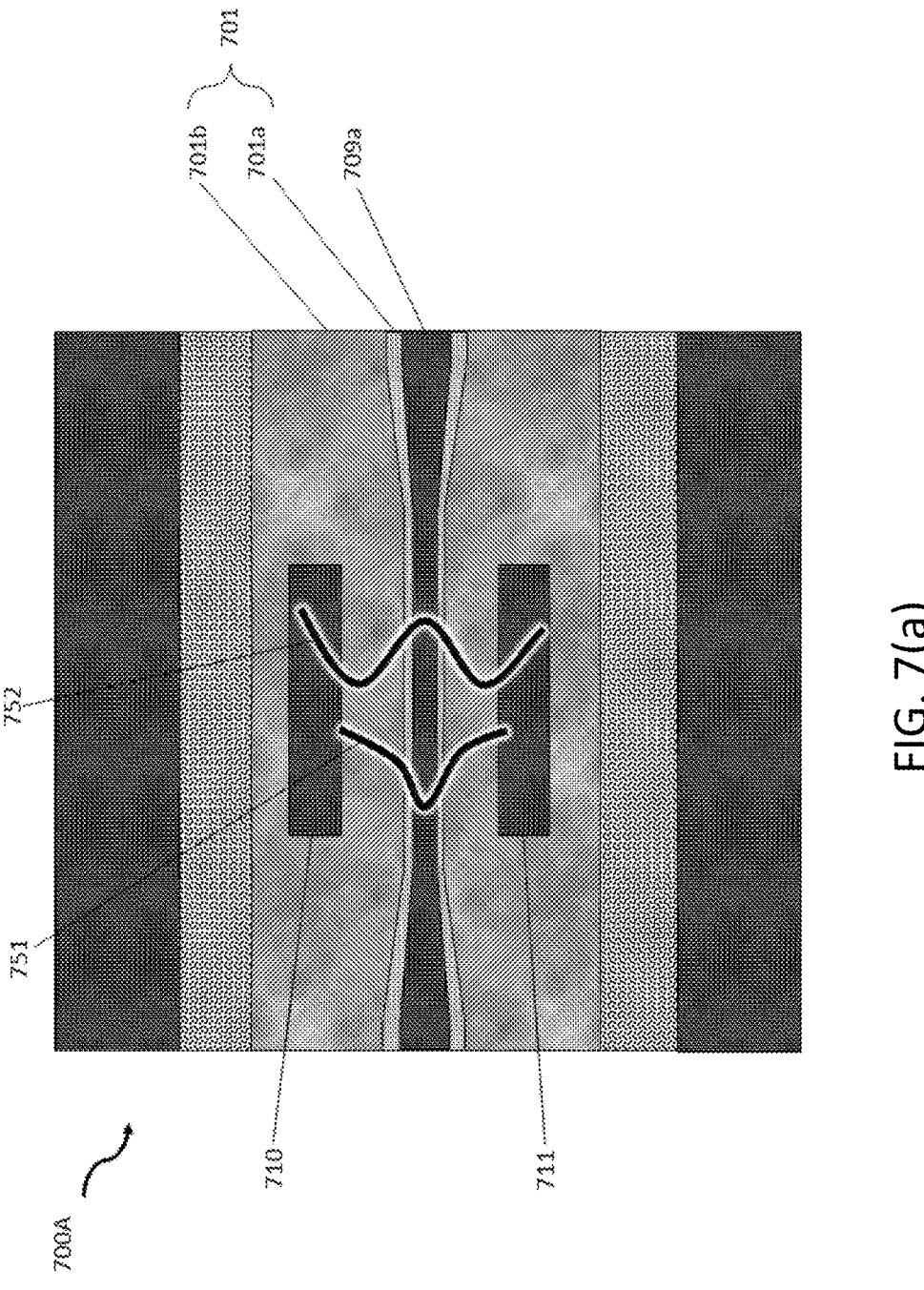
FIGS. 7(a) to (c) shows cross-sectional top-down views of a device according to some embodiments of the present invention.
Figure 7B:
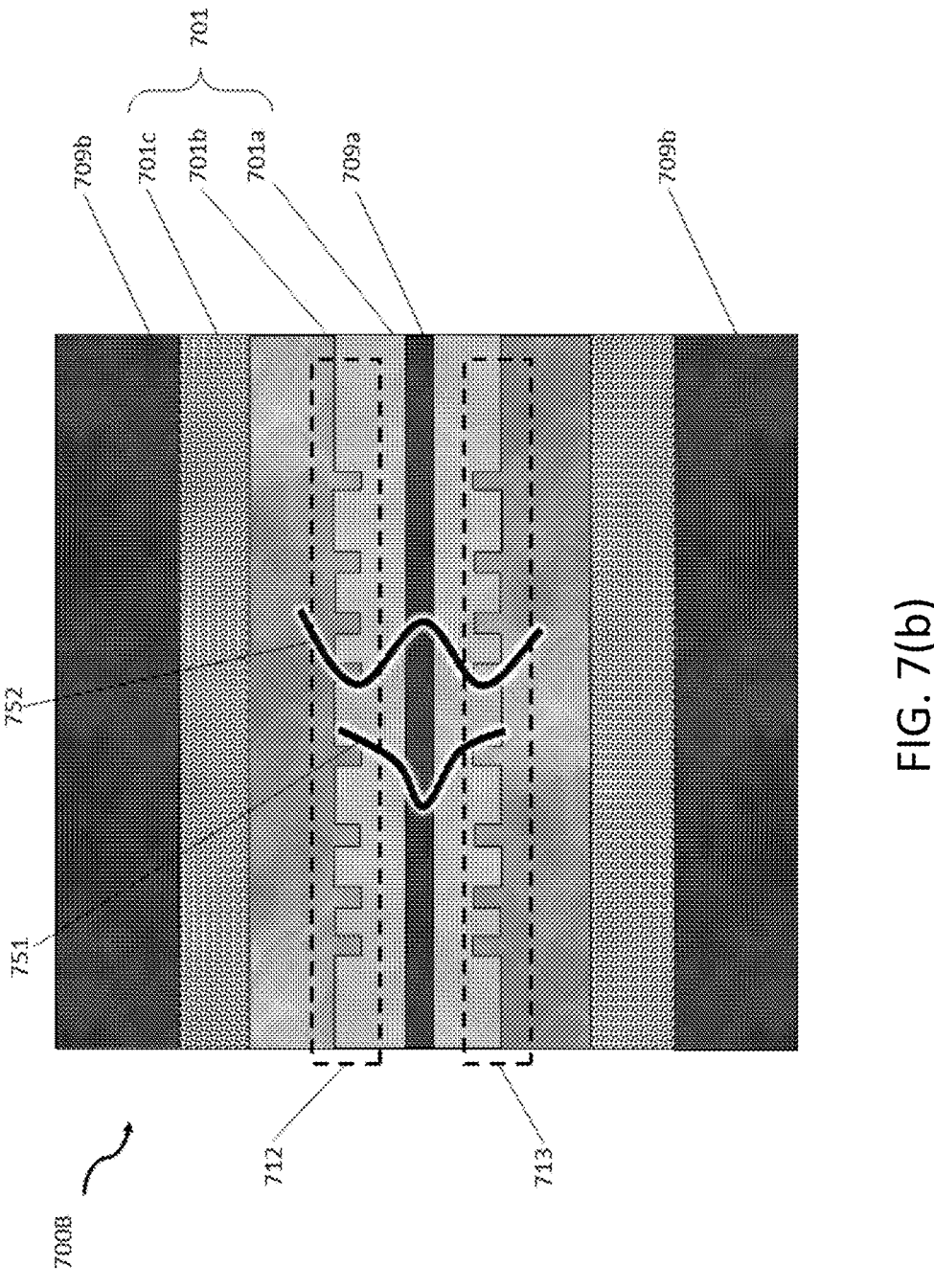
Figure 7C:
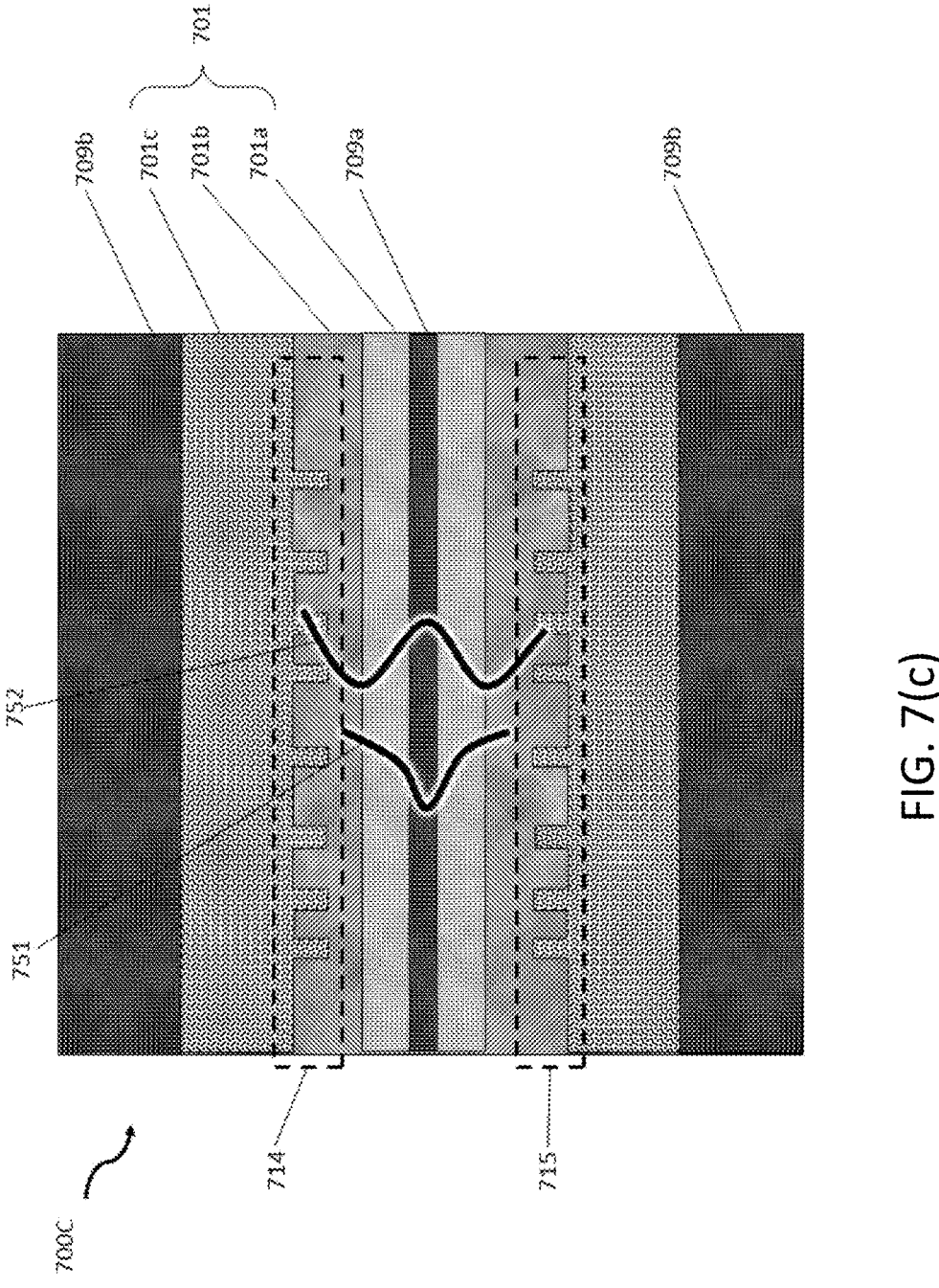

FIG. 7 offers a three top-down views 700A, 700B and 700C of certain embodiments of an integrated photonic devices utilizing modal gain control structures. Functional layers 701, 701a, 701b, 701c, 709a, and 709b correspond to functional layers 401, 401a, 401b, 401c, 409a, and 409b as described in relation to cross-section 400G described with the help of FIG. 4 and to functional layer 601 to 609b as described in relation to cross-section 600 described with the help of FIG. 6.

In top-down view 700A, tapered structures in sublayer 701a enable change in the modal gain and/or number of supported modes inside the layer 701, with narrower sublayer 701a generally supporting lower number of modes and/or pushing the modes further out (up/down in view 700A). Metal 709a deposited on top of layer 701a can follow the taper structure (as shown in view 700A), or can have uniform width (not shown). Modal gain control structures, as illustrated in FIG. 7, are called taper structures for modal gain control. Taper structures for modal gain control can be combined with one or more of pad structures for modal gain control, two of which (710 and 711) are illustrated in embodiment shown in view 700A. Various other combinations of pad and taper structures for modal gain control can be utilized with intent to have different impact to the modal gain of different modes. In embodiment shown in view 700A, the effect of modal gain control structures is significantly weaker for mode 751 as its tail only slightly interacts with said structures, while the effect is significantly stronger for exemplary mode 752 as substantial part of the mode interacts with said structures.

In top-down view 700B, fin structures 712 and 713 are realized in layer 701a. By optimizing the dimensions of the fin structures, the impact on modes can be varied as suggested by the different overlaps between the fin structures 712 and 713 and optical modes 751 and 752. Fins can be non-uniform (as sketched in view 700B), can be uniformly periodic, pseudo-random or any other arrangement.

In top-down view 700C, fin structures 714 and 715 are realized in layer 701b. By optimizing the dimensions of the fin structures, the impact on modes can be varied as suggested by the different overlaps between the fin structures 714 and 715 and optical modes 751 and 752. Fins can be non-uniform (as sketched in view 700C), can be uniformly periodic, pseudo-random or any other arrangement. In general, the effect of fin structures 714 and 715 is smaller than the effect of fin structures 712 and 713, as they are typically further from the optical mode center, but additional optimizations, such as width of layer 701a defining the mesa/ridge, can be utilized to control the strength of fin structures.

In the remaining part of this disclosure, term modal gain control structure includes at least one of the mode gain control structures as described with the help of FIG. 6 cross-section 600 and FIG. 7 top-down views 700A, 700B and 700C which include pad structures, taper structures and fin structures for modal gain control. It is obvious to one skilled in the art that various combinations of said structures can be designed to enable precise modal gain control without limitation to their number, size, placement and orientation.

Embodiments of the present invention offer many benefits. The integration platform enables scalable manufacturing of PICs made from multiple materials and capable of handling high optical power compared to typical Si waveguide-based or InP waveguide-based PICs. The high-power operation is especially supported by the wall structures and modal gain control structures.

Previous approaches have generally used taper structures in order to transfer an optical mode from an active device to a passive device, where a width of compound semiconductor region is adiabatically tapered down to sub-micron size. However, a required width of the taper tip decreases rapidly to tens of nanometer sizes as the difference in refractive indices increases. The present invention deploys a butt coupling scheme to eliminate the need of a very small taper size in the compound semiconductor waveguide, which eases fabrication of such structures and can improve the performance removing the limitations associated with pumping very narrow structures.

Other approaches have relied on die attachment of pre-fabricated optical active devices to passive waveguides. This requires very stringent alignment accuracy which is typically beyond what a typical die-bonder can provide. This aspect limits the throughput of this process as well as the performance of optical coupling.

It is to be understood that optical coupling between modes in active and passive layers is reciprocal, so that, taking FIG. 5 as exemplary, the structure can be configured to facilitate light transmission from region 501 to region 502, but also to facilitate transmission in the reverse direction, from region 502 to region 501. In is to be understood that multiple such transitions with no limitation in their number or orientation can be realized on a suitably configured PIC.

Embodiments of the optical devices described herein may be incorporated into various other devices and systems including, but not limited to, various computing and/or consumer electronic devices/appliances, communication systems, sensors and sensing systems.

It is to be understood that the disclosure teaches just few examples of the illustrative embodiment and that many variations of the invention can easily be devised by those skilled in the art after reading this disclosure and that the scope of the present invention is to be determined by the following claims.

The invention claimed is:

1. A device comprising:

first, second and third element fabricated on a common substrate;

wherein the first element comprises an active waveguide structure supporting a first fundamental optical mode and first higher-order optical mode, the second element comprises a passive waveguide structure supporting a second optical mode, and the third element, at least partly butt-coupled to the first element, comprises an intermediate waveguide structure supporting intermediate optical modes;

wherein first element comprises at least three sublayers (401a, 401b, 401c) and a modal gain control structure;

wherein one of the sublayers, the active region sublayer (401b), of the first element is positioned between two other sub-layers and comprises an active region comprising at least one of quantum wells and quantum dots;

wherein the modal gain control structure including at least one of pad structures comprising metal or having bandgap below a photon energy of the modes in active waveguide structure is placed directly on top of the active region sublayer without a contact sublayer between the modal gain control structure and the active region sublayer;

wherein an overlap between the first higher-order optical mode and at least one of the modal gain control structures is larger than the overlap between the first fundamental optical mode and the same modal gain control structure;

wherein a tapered waveguide structure in at least one of the second and third elements facilitate efficient adiabatic transformation between the second optical mode and one of the intermediate optical modes;

wherein no adiabatic transformation occurs between any of the intermediate optical modes and the first optical mode; and wherein mutual alignments of the first, the second and the third element are defined using lithographic alignment marks that facilitate precise alignment between layers formed during processing steps of fabricating the first, the second and the third element.

2. The device of claim 1, wherein a lower surface of the third element is planar.

3. The device of claim 1, wherein an interface between the first and the third element is angled at an angle optimized to minimize reflections.

4. The device of claim 3, further comprising:

an anti-reflective coating layer deposited on at least one angled interface.

5. The device of claim 1, wherein the first element comprises at least three sub-layers, where in at least one of the sub-layers in the active waveguide structure comprises a n-contact layer, at least one of the sub-layers in the active waveguide structure comprises a p-contact layer, and at least one of the sub-layers in the active waveguide structure comprises an active region.

6. The device of claim 5, wherein the active region comprises quantum wells.

7. The device of claim 5, wherein the active region comprises quantum dots.

8. The device of claim 5, wherein the active region comprises a pin-junction.

9. The device of claim 5, wherein the active region comprises a pn-junction.

10. The device of claim 1, wherein the active waveguide structure and the intermediate waveguide structure at butt-coupled interface have a wall region which is widened near the butt-coupled interface.

11. The device of claim 10, wherein cross-sections of structures defining mode guiding in the active waveguide structure and the intermediate waveguide structure are enlarged at the wall region using a gradual taper.

12. The device of claim 10, wherein cross-sections of structures defining mode guiding in the active waveguide structure and the intermediate waveguide structure are enlarged at wall region using an abrupt transition.

13. The device of claim 1, wherein the second element comprises silicon nitride.

14. The device of claim 1, wherein the second element comprises lithium niobate.

15. The device of claim 1, wherein the second element comprises tantalum pentoxide.

\* \* \* \* \*